CONNECTING DEVICE FOR CONSOLIDATING THE HOUSING
OF A SEMICONDUCTOR DEVICE
Filed June 12, 1964

United States Patent Office 3,310,716

Patented Mar. 21, 1967

3,310,716

CONNECTING DEVICE FOR CONSOLIDATING THE HOUSING OF A SEMICONDUCTOR DEVICE

Reimer Emeis, Ebermannstadt, Germany, assignor to Siemens-Schuckertwerke Aktiengesellschaft, Siemensstadt and Erlangen, Germany, a corporation of Germany Filed June 12, 1964, Ser. No. 374,800

Claims priority, application Germany, June 15, 1963, S 85,696

6 Claims. (Cl. 317—234)

My invention relates to encapsulated electronic semiconductor devices comprising a crystalline semiconductor body of germanium, silicon or intermetallic semiconductor compounds and containing zones of respectively different conductance types forming one or more p-n junctions.

In a more particular aspect, the invention concerns encapsulated semiconductor devices of the type described in the copending application of H. Martin, Ser. No. 214,076, filed Aug. 1, 1962, now Patent No. 3,280,389 and assigned to the assignee of the present invention. In a device of this type, a semiconductor member having alloy-bonded electrodes is provided on its opposite flat sides with bracing bodies which consist of a material whose thermal coefficient of expansion is not appreciably different from that of the semiconductor material. The semiconductor member is located in a housing composed of an insulating ring-shaped frame covered on both sides by conducting plates of preferably ductile material between which the semiconductor member is glidably held, while protuberances of the cover plates prevent the semiconductor member from excessively shifting in lateral directions. The semiconductor member is not current-conductively or heat-conductively clamped between the cover plates. Such clamping rather is effected by additional holding structures which, when the encapsulated device is being mounted for use, are pressed from the outside against the cover plates and may then also act as heat sinks. These external devices, effective only after installing the encapsulated semiconductor device proper, operate to force the cover plates from both sides against the bracing plates of the encapsulated semiconductor member. The bracing plates may consist of molybdenum, tungsten or an iron-nickel-cobalt alloy, for example.

It is an object of my invention to improve encapsulated semiconductor devices of the above-mentioned type for the purpose of reducing or virtually eliminating difficulties heretofore encountered when completing and sealing the housing structure by hard soldering or brazing, thus greatly facilitating the assembling of such encapsulated semiconductor devices.

To this end, and in accordance with a feature of my invention, the housing which encloses the above-mentioned semiconductor disc member with alloy-bonded electrodes on both flat sides and with the above-mentioned bracing plates on the electrodes at both sides of the member, is constituted by two ring-shaped insulating frame pieces which are coaxially mounted and mutually adjacent and of which each is peripherally joined and sealed with only one of the respective two cover plates on the side of the insulator facing away from the other insulator. The two ring-shaped insulators are joined with each other by metallic connecting means. Preferably both ring-shaped insulators have the same shape of a circular cylinder, and the same size as to inner and outer diameters and axial thickness, thus consisting of geometrically identical parts.

The invention will be further described with reference to embodiments illustrated by way of example in the accompanying drawing, in which.

Figure 1:
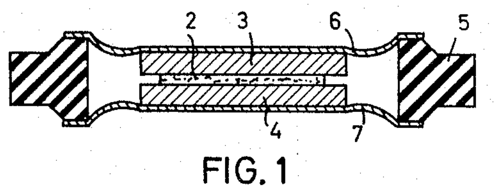
FIG. 1 shows in cross section an encapsulated semiconductor device of the type introductorily described and improved by virtue of the present invention.

The device shown in FIG. 1 comprises a semiconductor p-n junction member 2 in the shape of a circular disc consisting of silicon and having alloyed electrodes on top and bottom faces. Firmly bonded to the member 2 are bracing plates 3 and 4 of molybdenum. The ring-shaped insulating frame 5 surrounds the periphery of the semiconductor member with radial clearance. Fastened to the insulating frame 5 are two ductile cover pates 6 and 7 consisting, for example, of silver. They are provided with respective circular and coaxial bulges which prevent the semiconductor member from axial displacements. If desired, only one of the two bracing plates may be firmly bonded to the semiconductor member 2, and the other bracing plate may be loosely inserted.

During the production of such an encapsulated semiconductor device, considerable difficulties have been encountered because, after the semiconductor member composed of the parts 2 to 4 is inserted, at least one of the cover plates 6 or 7 must still be fastened to the insulating ring 5. This is preferably done by soft-soldering the periphery of the cover plate to a metallized rim portion of the insulating ring 5.

It is a more specific object of my invention to obviate the difficulties resulting from the necessity of ultimately sealing the capsule in the manner just described. This result is achieved by the following novel design of the encapsulating housing shown in FIG. 2. The insulating ring-shaped frame is divided into two ring portions 11 and 12, each having preferably the shape of a hollow cylinder. The rings preferably consist of sintered aluminum oxide (alumina, $Al_2O_3$). Fastened to each of the insulating rings 11 and 12 is one of the cover plates 13 or 14. The fastening is done separately and before the housing is assembled with the semiconductor member. When the housing is being assembled, the two insulating rings 11 and 12 are placed coaxially upon each other and can be readily joined together.

Figure 3:
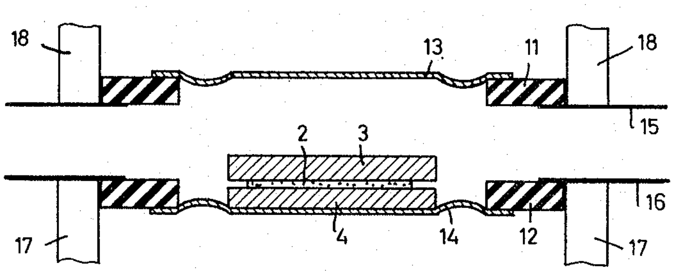
FIG. 3 shows the same device as FIG. 2 during a stage of its manufacture.

FIG. 3 shows the final assembling stage. The semiconductor member comprising the parts 2 to 4 is placed upon the bottom of the housing portion formed by parts 12, 14 and 16. The other housing portion, comprising parts 11, 13 and 15, is then placed from above onto the lower portion. Thereafter, two metallic connecting parts 15 and 16 previously joined with the respective rings 11 and 12 are pressed together with the aid of plunger-like tools 17 and 18. Now the protruding edge of the now mutually adjoining portions 15 and 16 are joined together by hard-soldering or welding, particularly argon-arc welding. The connecting parts 15 and 16 preferably consist of a material, such as an iron-nickel-cobalt alloy, particularly suitable for such welding operations. During soldering or welding, the tools 17 and 18 may serve to dissipate the excessive amount of heat so that the semiconductor member consisting of parts 2 to 4 is not exposed in the interior of the housing to any detrimental effect of the soldering or welding operation. The pressing tools 17 and 18 may consist of copper, for example. If desired, the protruding edges of the respective connecting parts 15 and 16 may also be joined together by mechanical deformation, such as by crimping.

Figure 2:
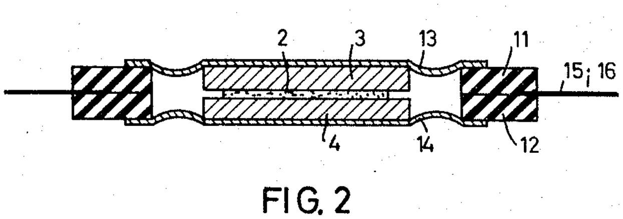
FIG. 2 shows in section a corresponding device embodying the invention.

Semiconductor devices according to FIG. 2 can be stacked in accordance with the above-mentioned application Serial No. 214,076, now Patent No. 3,280,389, to obtain multi-unit semiconductor assemblies with inserted cooling plates or heat sinks, whereafter the entire stack is tensioned by disc-type springs or helical springs.

The encapsulation according to the invention is applicable not only to rectifier diodes as shown on the drawing but is also applicable to controllable semiconductor devices, for example transistors or four-layer devices for switching purposes such as silicon-controlled rectifiers. In this case, the top and bottom side of the semiconductor member, being in contact with the metallic cover plates 13 and 14 respectively, serve for supplying the load current, whereas the third control electrode may be provided with a terminal conductor extending laterally between the metallic connecting parts 15 and 16 to the outside of the housing. For example, one of the bracing plates 3 or 4 may be made smaller in diameter than the semiconductor disc 2, and the control electrode may then have the shape of a ring and extend around the smaller bracing plate. A wire soldered to the ring-shaped electrode can then be connected to one of the connecting parts 15, 16 and the external circuit connection can then be attached to the ring-shaped parts 15, 16. According to another modification, one of the bracing plates is provided with a lateral recess in which, for example, the ignition electrode of a four-layer semiconductor member, such as a semiconductor-controlled rectifier, is arranged and from which a lateral connection extends to one of the connecting parts 15, 16 and hence between the insulating rings 11 and 12 to the outside of the housing in a manner similar to the device known from FIG. 4 of the German published patent application 1,132,247.

Figure 4:
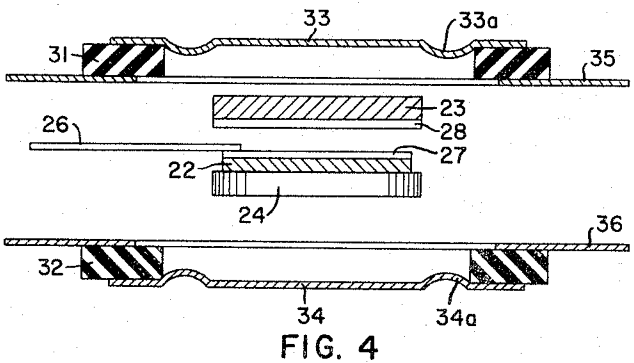
FIG. 4 shows in section and exploded fashion another embodiment of the invention.

The device illustrated in FIG. 4 embodies the above-mentioned modifications in an encapsulated silicon controlled rectifier. A p-n-p silicon disc 22 of circular shape carries on its flat top side an emitter electrode (not visible in FIG. 4) and a strip-shaped base contact 27, both alloyed together with the silicon material. Alloyed to the flat bottom side is a collector electrode joined with a reinforcing disc 24 of molybdenum whose bottom side is lapped to planar shape. Soldered to one end of the base contact 27 is a current supply lead 26 consisting of a gold or silver strip having a thickness of 0.1 mm., for example. Another molybdenum disc 23 is placed on top of the silicon disc 22. The top side of disc 23 is lapped to planar shape. The bottom side has a groove 28 of about 0.5 mm. depth, the surface being gold plated. The molybdenum disc 23 is placed upon the top of the silicon disc so that the groove straddles the base contact 27 with sufficient clearance to keep the molybdenum disc 23 insulated from the base contact and its lead 26. The groove 28 may be lined with insulation such as mica or insulating varnish. The parts 23 and 22 are pressed together and tempered at a temperature not exceeding the permissible operating temperature, thus rigidly and permanently joining the parts 22 and 23 together.

The rectifier member just described is encapsulated in a housing which comprises two ring-shaped frame portions 31 and 32 of ceramic material. The top surface of ring 31 is metallized and soldered together with a cover plate 33 of ductile metal, preferably silver, which has a circular bulge 33*a*. The ring 32 has a metallized bottom surface soldered together with a cover plate 34 of silver likewise provided with a circular bulge 34*a*.

The likewise metallized bottom and top faces respectively of the ceramic rings 31 and 32 are joined with ring-shaped plates 35 and 36 of steel or iron-nickel-cobalt alloy. The ring plates 35 and 36 protrude radially and peripherally outward from the ceramic rings. When the housing is assembled, the plates 35 and 36 are in face-to-face contact with each other and are hermetically joined and sealed to each other around their periphery by soldering, welding, crimping or thermocompression. In this manner the semiconductor member is gastightly encapsulated, and the base lead 26 is electrically connected with the metal plates 35 and 36 which can be externally connected into the operating circuit.

To those skilled in the art, such and other modifications will be obvious upon a study of this disclosure and are indicative of the fact that the invention can be given embodiments other than particularly illustrated and described herein, without departing from the essential features of the invention and within the scope of the claims annexed hereto.

I claim:

1. An encapsulated semiconductor device, comprising a disc-shaped semiconductor p-n junction member having alloy-bonded electrodes on its two flat sides, respective bracing plates face-to-face bonded to said electrodes and consisting of conductive material whose thermal expansion substantially corresponds to that of said member, a housing having two ring-shaped insulators of determined diameters coaxially surrounding said member, two conducting cover plates of which each has its rim portion joined and sealed to one of said respective insulators on the side remote from said other insulator and in coaxial relation thereto, said semiconductor member being located between said two cover plates with said bracing plates in glidable engagement with said respective cover plates, said cover plates having protuberance means for limiting lateral displacement of said member, and connector means joining said two ring-shaped insulators with each other, said connector means comprising a pair of ring-shaped metal plates having diameters greater than the diameters of said ring-shaped insulators and joined face to face to each other in their areas beyond said ring-shaped insulators, one of said pair of ring-shaped metal plates being affixed to one of said ring-shaped insulators on the side adjacent the other of said ring-shaped insulators and the other of said pair of ring-shaped metal plates being affixed to the other of said ring-shaped insulators on the side adjacent said one of said ring-shaped insulators.

2. In an encapsulated semiconductor device according to claim 1, said two ring-shaped insulators having the same cylindrical shape and size.

3. A semiconductor device according to claim 1, comprising conductor means extending between said two ring-shaped insulators from within to the outside of said housing, and said member having an electrode connected to said conductor means.

4. An encapsulated semiconductor device as claimed in claim 1, wherein said pair of ring-shaped metal plates have the same size and shape.

5. An encapsulated semiconductor device as claimed in claim 1, wherein said ring-shaped metal plates comprise an iron-nickel-cobalt alloy.

6. An encapsulated semiconductor device as claimed in claim 1, wherein said ring-shaped metal plates comprise steel.

References Cited by the Examiner

UNITED STATES PATENTS

| | | | |
|---|---|---|---|
| 2,728,881 | 12/1955 | Jacobi | 317—235 |
| 2,876,401 | 3/1959 | Fuller | 317—235 |
| 2,882,116 | 4/1959 | Williams | 316—19 |
| 2,999,964 | 9/1961 | Glickman | 317—234 |
| 3,160,800 | 12/1964 | Smart | 317—135 |
| 3,196,203 | 7/1965 | Keller | 317—235 X |
| 3,226,466 | 12/1965 | Martin | 317—234 X |

FOREIGN PATENTS

| | | |
|---|---|---|
| 239,889 | 8/1962 | Australia. |

JOHN W. HUCKERT, *Primary Examiner.*

A. M. LESNIAK, *Assistant Examiner.*